United States Patent
Yang et al.

(10) Patent No.: US 11,233,016 B2
(45) Date of Patent: *Jan. 25, 2022

(54) ARRAY SUBSTRATE WITH STATIC CHARGE RELEASING PATTERN AND METHOD FOR PRODUCING THE SAME

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Xiaofei Yang, Beijing (CN); Zailong Mo, Beijing (CN); Yanxia Xin, Beijing (CN); Ke Dai, Beijing (CN); Yawen Zhu, Beijing (CN); Lei Su, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 25 days.

This patent is subject to a terminal disclaimer.

(21) Appl. No.: 16/601,351

(22) Filed: Oct. 14, 2019

(65) Prior Publication Data

US 2020/0043871 A1 Feb. 6, 2020

Related U.S. Application Data

(63) Continuation-in-part of application No. 15/502,132, filed as application No. PCT/CN2016/094837 on Aug. 12, 2016, now Pat. No. 10,483,219.

(30) Foreign Application Priority Data

Jan. 4, 2016 (CN) .......................... 201610003750.3

(51) Int. Cl.
*H01L 23/60* (2006.01)
*H01L 27/12* (2006.01)

(52) U.S. Cl.
CPC ............ *H01L 23/60* (2013.01); *H01L 27/127* (2013.01); *H01L 27/1244* (2013.01)

(58) Field of Classification Search
CPC ........................... H01L 23/60; H01L 27/1244
(Continued)

(56) References Cited

U.S. PATENT DOCUMENTS 5,068,748 A 11/1991 Ukai et al.
5,909,035 A 6/1999 Kim
(Continued)

FOREIGN PATENT DOCUMENTS

CN 101135820 A 3/2008
CN 102945846 A 2/2013
(Continued)

OTHER PUBLICATIONS

International Search Report and Written Opinion dated Nov. 23, 2016, for corresponding PCT Application No. PCT/CN2016/094837.

(Continued)

*Primary Examiner* — Robert T Huber
(74) *Attorney, Agent, or Firm* — Kinney & Lange, P.A.

(57) ABSTRACT

An array substrate and a method for producing the same are disclosed. The array substrate includes a metal pattern and an electrically conductive pattern sequentially formed on a base substrate, the electrically conductive pattern being insulated from the metal pattern. The array substrate further includes a static charge releasing pattern formed in a same layer and made of a same material as the electrically conductive pattern, and which is insulated from the electrically conductive pattern. The metal pattern is a signal line (Continued)

running through a display area of the array substrate, and includes an input end, an output end, and a body portion between the input end and the output end. The output end of the signal line includes an island-like structure, and a width of the island-like structure is greater than that of the body portion. The static charge releasing pattern is electrically connected with the island-like structure.

16 Claims, 6 Drawing Sheets

(58) Field of Classification Search
USPC .......................................... 257/786, E23.145
See application file for complete search history.

(56) References Cited

U.S. PATENT DOCUMENTS

| | | | |
|---|---|---|---|
| 6,380,591 B1 * | 4/2002 | Kawano | ............ G02F 1/136204 |
| | | | 257/359 |
| 10,483,219 B2 * | 11/2019 | Yang | ................... H01L 27/1244 |
| 2004/0256675 A1 | 12/2004 | McNeil | |
| 2006/0023135 A1 | 2/2006 | Park | |
| 2008/0023837 A1 | 1/2008 | Chen | |
| 2010/0238095 A1 | 9/2010 | Zhang | |

FOREIGN PATENT DOCUMENTS

| | | |
|---|---|---|
| CN | 103513459 A | 1/2014 |
| CN | 104460070 A | 3/2015 |
| CN | 104979217 A | 10/2015 |
| CN | 105489596 A | 4/2016 |
| CN | 205385018 U | 7/2016 |

OTHER PUBLICATIONS

First Chinese Office Action dated Sep. 22, 2017, for corresponding Chinese Application No. 201610003750.3.
Second Chinese Office Action dated May 25, 2018, for corresponding Chinese Application No. 201610003750.3.

* cited by examiner

US 11,233,016 B2

ARRAY SUBSTRATE WITH STATIC CHARGE RELEASING PATTERN AND METHOD FOR PRODUCING THE SAME

CROSS-REFERENCE TO RELATED APPLICATIONS

This application is a Continuation-In-Part of U.S. application Ser. No. 15/502,132 filed on Feb. 6, 2017, which in turn is a Section 371 National Stage Application of International Application No. PCT/CN2016/094837, filed on Aug. 12, 2016, entitled "ARRAY SUBSTRATE AND METHOD FOR PRODUCING THE SAME" which in turn claims benefit of Chinese Application No. 201610003750.3, filed on Jan. 4, 2016, all of which are incorporated herein by reference in their entireties.

TECHNICAL FIELD

The present disclosure relates to a field of display, more particularly, to an array substrate and a method for producing the same.

BACKGROUND

In the conventional process for producing an array substrate, an electrically conductive pattern is typically deposited by plasma glow discharging method. In this way, in the deposition process, more or less electrons will enter the metal pattern that has been formed previously, such that static charge is accumulated in the metal pattern to cause breakdown of adjacent insulated layers, which in turn leads to short circuit between the metal pattern and other electrically conductive patterns. It may degrade display effects seriously and adversely influence user's experiences.

In view of this, it is desired to provide a technical solution for eliminating the static charges produced from the electrically conductive pattern and entering into the metal pattern during forming the electrically conductive pattern.

SUMMARY

Some embodiments of the present disclosure provide an array substrate, comprising a metal pattern and an electrically conductive pattern which are sequentially formed on a base substrate, the electrically conductive pattern being insulated from the metal pattern, wherein the array substrate further comprises: a static charge releasing pattern formed in a same layer as the electrically conductive pattern and made of a same material as the electrically conductive pattern, the static charge releasing pattern being insulated from the electrically conductive pattern and electrically connected with the metal pattern, wherein the metal pattern is a signal line which runs through a display area of the array substrate, and the signal line comprises: an input end; an output end; and a body portion between the input end and the output end, wherein the output end of the signal line comprises an island-like structure, and a width of the island-like structure is greater than a width of the body portion, wherein the static charge releasing pattern is electrically connected with the island-like structure.

In some embodiments, an insulating layer is disposed between the electrically conductive pattern and the metal pattern; and a via hole is disposed in the insulating layer and the static charge releasing pattern is electrically connected to the metal pattern through the via hole.

In some embodiments, the metal pattern is a gate line, the array substrate comprises a plurality of rows of pixels and a plurality of gate lines, each of the plurality of gate lines is connected to a row of pixels, an input end of an odd gate line connected with an odd row of pixels is connected to a first gate line driving circuit, and an input end of an even gate line connected with an even row of pixels is connected to a second gate line driving circuit, wherein an output end of the odd gate line connected with the odd row of pixels is located on a side of the display area, and an output end of the even gate line connected with the even row of pixels is located on the other side of the display area opposite to the side.

In some embodiments, the island-like structure is rectangular.

In some embodiments, the first static charge releasing pattern is in a shape of a rectangle having an area of 25 $\mu m^2$ to 400 $\mu m^2$.

In some embodiments, an orthographic projection of the static charge releasing pattern on the base substrate at least partially overlaps an orthographic projection of the island-like structure on the base substrate.

In some embodiments, the static charge releasing pattern is electrically connected with the island-like structure through at least two via holes in the insulating layer.

In some embodiments, the array substrate further comprises: a common electrode signal line disposed in the same layer as the metal pattern and adjacent to the display area, wherein the common electrode signal line has a groove whose opening is disposed toward the display area, and the island-like structure is disposed in the groove.

In some embodiments, the metal pattern is a gate line, and the electrically conductive pattern comprises a source-drain metal layer pattern.

In some embodiments, the electrically conductive pattern further comprises a data line.

In some embodiments, the metal pattern is a gate line, and the electrically conductive pattern comprises a transparent electrode.

In some embodiments, the transparent electrode comprises a pixel electrode or a common electrode.

In some embodiments, the metal pattern is a data line, and the electrically conductive pattern comprises a transparent electrode.

In some embodiments, the transparent electrode comprises a pixel electrode or a common electrode.

Some embodiments of the present disclosure provide a method for producing an array substrate, comprising a step of sequentially forming a metal pattern and an electrically conductive pattern on a base substrate; wherein in a patterning process for forming the electrically conductive pattern, an static charge releasing pattern insulated from the electrically conductive pattern and electrically connected with the metal pattern is also formed, the static charge releasing pattern being formed in a same layer as the electrically conductive pattern and made of a same material as the electrically conductive pattern, wherein the metal pattern is a signal line which runs through a display area of the array substrate, and the signal line comprises: an input end; an output end; and a body portion between the input end and the output end, wherein the output end of the signal line comprises an island-like structure, and a width of the island-like structure is greater than a width of the body portion, wherein the static charge releasing pattern is electrically connected with the island-like structure.

In some embodiments, the method further comprises: a step of forming an insulating layer which is disposed between the electrically conductive pattern and the metal pattern and has a via hole; wherein the static charge releasing pattern is electrically connected to the island-like structure through the via hole.

DETAILED DESCRIPTION OF THE EMBODIMENTS

In order that the technical problem, solutions and advantages of the present disclosure become clearer, the present disclosure will be explained with reference to accompanied drawings and specific embodiments.

The present disclosure provides a technical solution for solving the problem that static charges are likely to be produced in a metal pattern in the conventional process for producing an array substrate.

Figure 1:
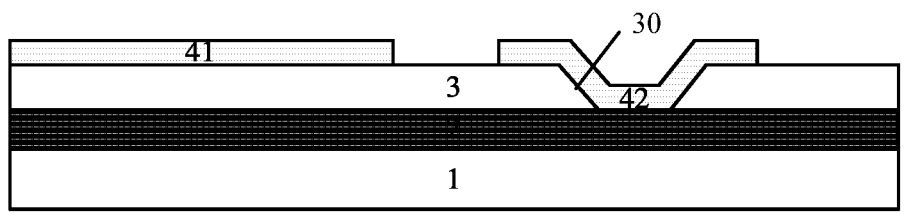
FIG. 1 is a schematic view showing a structure of an array substrate according to some embodiments of the present disclosure.

In an aspect, some embodiments of the present disclosure provide an array substrate. As shown in FIG. 1, the array substrate includes a metal pattern 2 and an electrically conductive pattern 41 formed sequentially on a base substrate 1. The electrically conductive pattern 41 is arranged in a different layer from the layer in which the metal pattern 2 is arranged and is insulated from the metal pattern 2. The array substrate of the present embodiments further includes a static charge releasing pattern 42 formed in a same layer as the electrically conductive pattern 41 lies and formed by a same material as the electrically conductive pattern 41. The static charge releasing pattern 42 is insulated from the electrically conductive pattern 41 (that is, the static charge releasing pattern 42 is separated from the electrically conductive pattern 41) and electrically connected with the metal pattern 2.

In the present embodiment, the static charge releasing pattern connected to the metal pattern is additionally formed in the process for forming the electrically conductive pattern. The static charge releasing pattern is configured to release a part of static charges in the metal pattern to prevent the static charges in the metal pattern from breaking through the metal pattern to the electrically conductive pattern, thereby avoiding short circuit between the metal pattern and the electrically conductive pattern. Since the static charge releasing pattern and the electrically conductive pattern may be formed in the same patterning process, the cost for producing the array substrate of the present embodiments will not be greater than that in the prior art. Thus, the array substrate according to the present disclosure is applicable.

As a high resolution display screen with a narrow frame is popular in recent market, an available space in the array substrate becomes reduced. The static charge releasing pattern mentioned in the present disclosure is not present in the prior art, and thus how to arrange it in a limited space becomes difficult.

To this end, the present disclosure provides a technical solution. Generally, the metal pattern in the present embodiments is or indicates a signal line arranged on the array substrate and configured to control a thin film transistor switch. In the conventional array substrate, a crimping region (i.e., PAD region) is provided. In this region, an external connection terminal of the signal line is formed. An external signal apparatus, such as an IC chip for controlling picture display or a probe of a detection apparatus configured to measure yield of the array substrate, transmits a signal to the signal line via the external connection terminal. To this end, in the present embodiments the static charge releasing pattern may be connected with an input end of the signal line and formed in the crimping region, so that the static charge releasing pattern may also be used as the conventional external connection terminal to save the space of the array substrate. In an example, the static charge releasing pattern may have a rectangular shape to meet requirements of the external connection terminal. The rectangular shape of the static charge releasing pattern may have an area of 25 m$^2$ to 400 m$^2$.

In addition, the static charge releasing pattern in the present embodiments may also be directly arranged in a display area and connected with an output end of the signal line, so as to prevent an outer space of the display area from being occupied, thereby meeting requirements of a size of the display apparatus with a narrow frame.

Certainly, in an embodiment, a plurality of static charge releasing patterns may be provided. Some of the static charge releasing patterns may be used as external connection terminals arranged in the crimping region, and the others may be arranged in the display area and connected to the output end of the signal line.

Further, it should be noted that, as shown in FIG. 1, the electrically conductive pattern 41 and the metal pattern 2 in the embodiments may be insulated from each other by an insulating layer 3 and the static charge releasing pattern may be electrically connected to the metal pattern 2 through a via hole 30 in the insulating layer 3.

Certainly, in practice, the metal pattern in the embodiments is typically the signal line, such as a gate line, a data line and the like. The electrically conductive pattern formed following formation of the signal line may be a transparent electrode or other signal lines. Herein the transparent electrode may be a common electrode, a pixel electrode or the like. The insulated layer described herein may be a pattern layer, or be widely referred to all insulating layers between the metal pattern and the electrically conductive pattern.

With reference to the embodiments of the present disclosure, the structure of the array substrate according to the present disclosure will be explained below in details.

Figure 2:
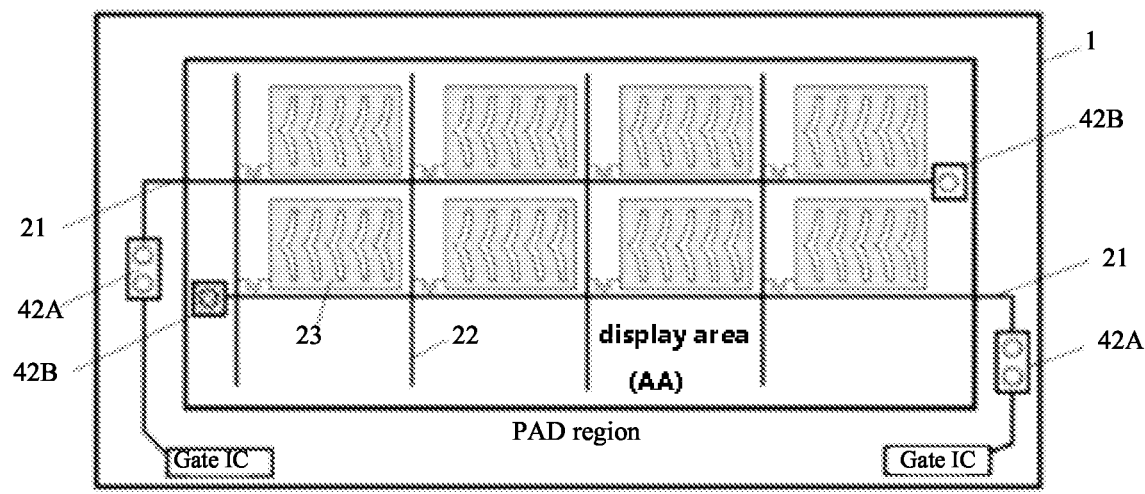
FIG. 2 is a schematic top view of an array substrate according to some embodiments of the present disclosure.

By taking the array substrate having a bottom gate type structure as an example, as illustrated in FIG. 2, the array substrate according to some embodiments includes: a base substrate 1; and a gate line 21, a data line 22, a first static charge releasing pattern 42A and a second static charge releasing pattern 42B formed on the base substrate 1. In an example, the gate line 21 corresponds to the metal pattern described herein; the data line 22 is the electrically conductive pattern described herein; and the first static charge releasing pattern 42A, the second static charge releasing pattern 42B and the data line 22 are formed in a same layer and formed by a same material. It should be noted that in the prior art, a source-drain metal layer pattern and the data line 22 are also formed in the same layer and formed by the same material, and thus the data line 22 in the embodiments may also indicate the source-drain metal layer.

Figure 3:
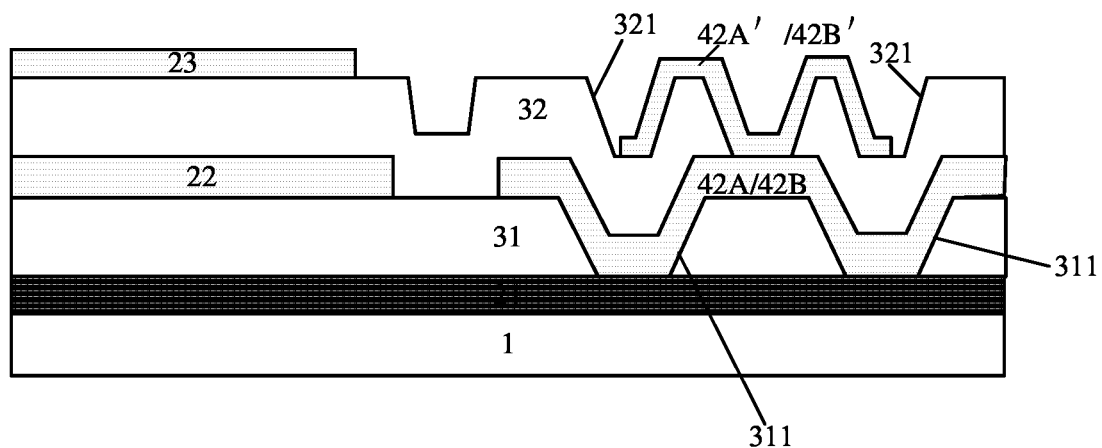
FIG. 3 is a schematic view, in cross-section, of an array substrate with a static charge releasing pattern according to some embodiments of the present disclosure.

Further, with reference to FIG. 3, a gate insulating layer 31 is provided between the first static charge releasing pattern 42A, the second static charge releasing pattern 42B and the gate line 21. The first static charge releasing pattern 42A and the second static charge releasing pattern 42B are connected to the gate line 21 through a via hole 311 in the gate insulating layer 31. In an example, the first static charge releasing pattern 42A is the external connection terminal arranged on the crimping region as described above. In FIG. 2, the first static charge releasing pattern 42A is connected with a driving circuit Gate IC of the gate line to load a scanning signal from the Gate IC.

If the first static charge releasing pattern 42A is used as the external connection terminal of a test signal line, it may be connected to the probe of the detection apparatus to load a test signal to the gate line 21 or receive the test signal from the gate line 21. Certainly, in order to obtain test results more accurately, resistance of the first static charge releasing pattern 42A may be reduced as much as possible. Thus, as an option, as shown in FIG. 3, the first static charge releasing pattern 42A may be connected with the gate line 21 through a plurality of via holes 311 in the gate insulating layer so as to enhance a cross sectional area for electric conduction.

Further, in the process for producing the array substrate, the data line 22 is not the finally formed electrically conductive pattern. A transparent electrode (such as a common electrode or a pixel electrode) may further be formed above the data line layer. By taking the pixel electrode 23 in FIG. 2 as an example, in the process for forming the pixel electrode 23, the static charges may also be introduced into the data line 22 and the gate line 21. Thus, the technical solution of the present disclosure may also be used to produce the static charge releasing pattern while the pixel electrode 23 is produced. The static charge releasing pattern may be connected to the data line 22 or the gate line 21. If it is connected to the data line 22, the data line 22 will be the metal pattern described herein.

In a practical structure, a passivation layer 32 is arranged between the pixel electrode 23 and the data line 22. The passivation layer 32 is substantially a kind of the insulating layer. Thus, in the embodiments of the present disclosure the static charge releasing pattern, arranged in a same layer as the pixel electrode 23 lies, may be connected to the data line 22 through a via hole formed in the passivation layer.

Certainly, as another option, with reference to FIG. 3, in another embodiments of the present disclosure the static charge releasing pattern 42A'/42B' arranged in the same layer as the pixel electrode 23 may also be electrically connected to the static charge releasing pattern 42A/42B arranged in the same layer as the data line 22 through the via hole 321 in the passivation layer 32. Thus, the static charges produced in the gate line 21 during deposition of the pixel electrode 23 may be released.

Thus, in the embodiment, the static charge releasing pattern may be composed of two parts. One part is arranged in the same layer as the data line 22, and the other part is arranged in the same layer as the pixel electrode 23. Similarly, as a corresponding variant, the static charge releasing pattern 42B' arranged in the same layer as the pixel electrode 23 will substitute the static charge releasing pattern 42B arranged in the same layer as the data line 22 to be used as the external connection terminal.

The above embodiments are provided only by way of examples. The pixel electrode 23 in FIG. 2 may be replaced by a common electrode equivalently. However, all of the static charge releasing patterns that are produced additionally and connected to the previously formed metal patterns in the process for forming the electrically conductive pattern should fall within the protection scope of the present disclosure.

In summary, the array substrate provided with the static charge releasing pattern in the present disclosure may eliminate the static charges produced in the process for producing the metal pattern, and no additional patterning process is needed for producing the static charge releasing pattern and hence the cost for producing the array substrate will not be increased. In addition, the static charge releasing pattern in the embodiments will also not occupy the space at an edge of the array substrate, and can be used for the display apparatus with a narrow frame. It conforms the current development trend of the display apparatus.

Some embodiments of the present disclosure also provide a method for producing an array substrate. The method includes a step of forming a metal pattern and an electrically conductive pattern on a base substrate sequentially.

In a patterning process of forming the electrically conductive pattern, a static charge releasing pattern insulated from the electrically conductive pattern and electrically connected to the metal pattern is also formed.

In the method according to the embodiment, the static charge releasing pattern connected with the metal pattern is additionally formed in the process for producing the electrically conductive pattern. The static charge releasing pattern is configured to release part of the static charges in the metal pattern to prevent the static charges from the metal pattern from breaking through the metal pattern to the electrically conductive pattern, thereby avoiding short circuit between the metal pattern and the electrically conductive pattern. Since the static charge releasing pattern may be formed by the patterning process of the electrically conductive pattern, the manufacturing cost of the array substrate in the embodiments will not be increased. The array substrate according to the present disclosure is highly applicable.

In a further embodiment, the method according to the embodiments further includes a step of forming an insulating layer which is arranged between the electrically conductive pattern and the metal pattern. In the step, by forming a via hole in the insulating layer, the static charge releasing pattern is connected to the metal pattern through the via hole in the insulating layer.

The method according to the embodiments will be explained below in details.

Figure 4A:
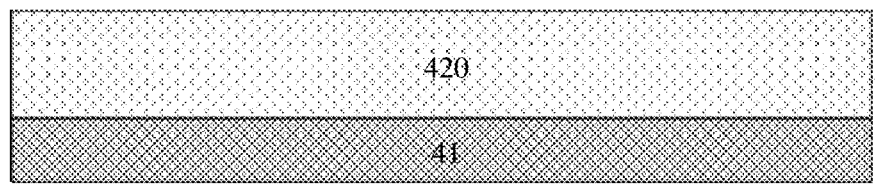
FIGS. 4A to 4F are schematic views showing a flowchart of a method for producing an array substrate according to some embodiments of the present disclosure.
Figure 4B:
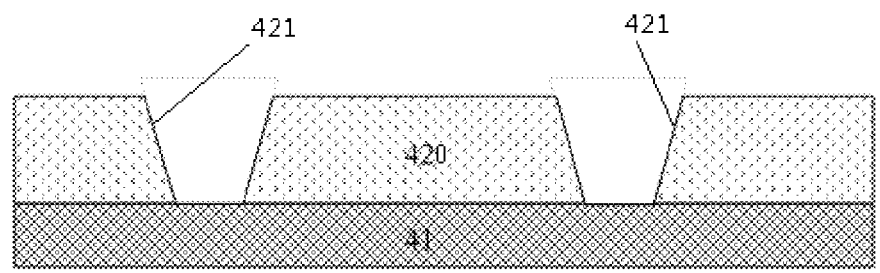
Figure 4C:
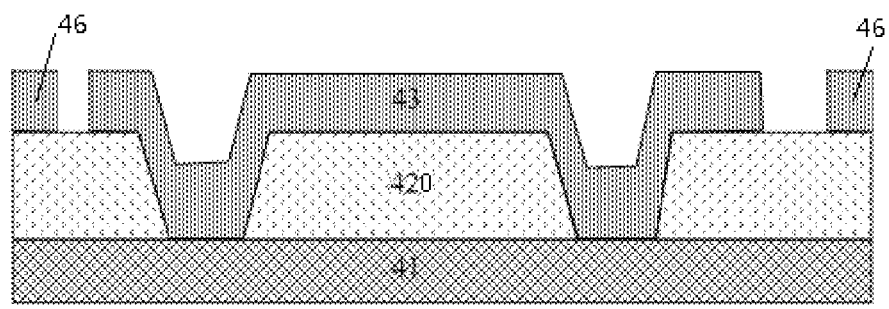
Figure 4D:
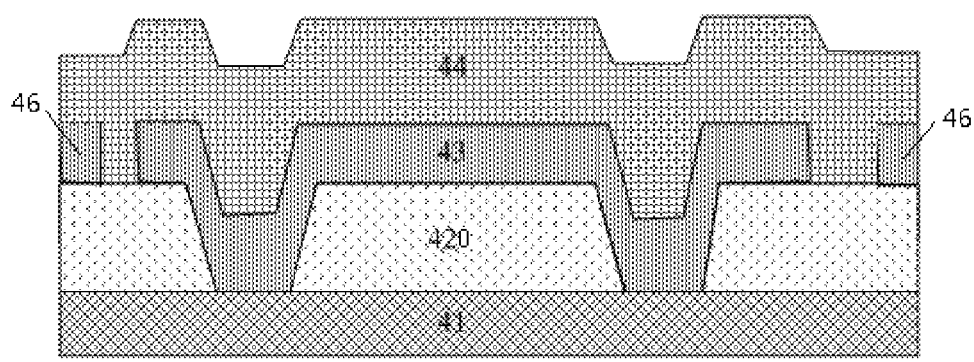
Figure 4E:
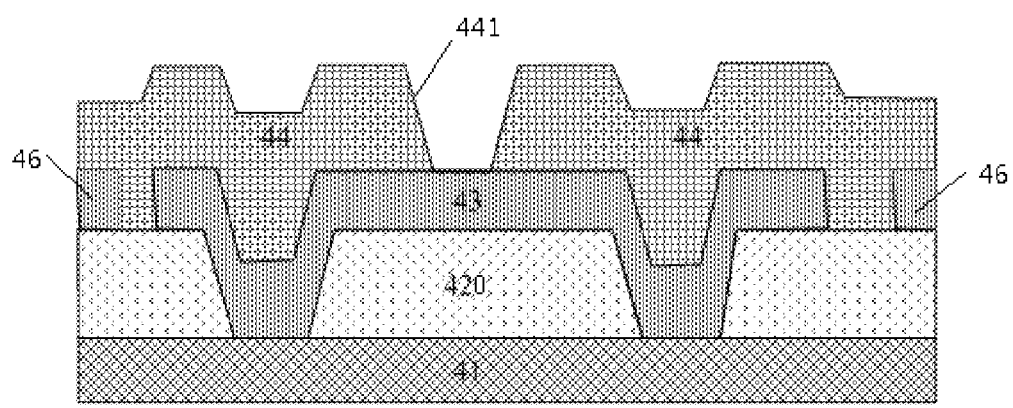
Figure 4F:
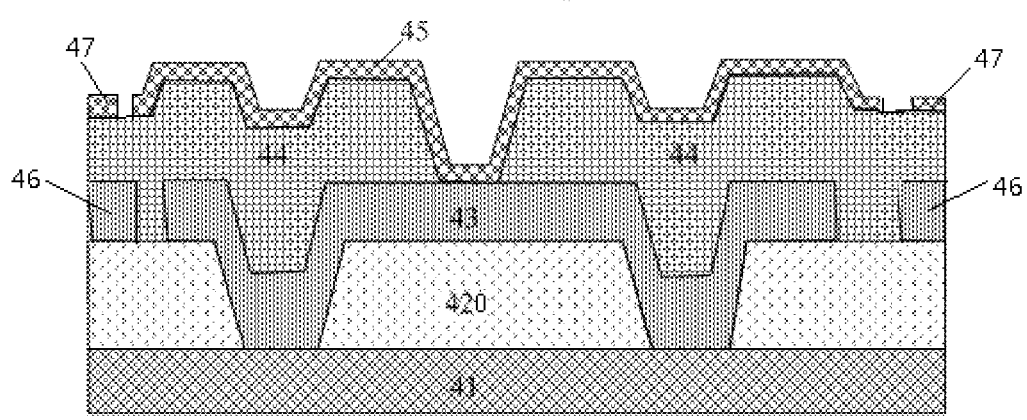

By taking a bottom gate type array substrate as an example, a gate line, a gate insulating layer, a source-drain metal pattern, a passivation layer and a transparent electrode are firstly formed sequentially on the array substrate. In order to eliminate the static charges produced onto the gate line by the source-drain metal pattern and the transparent electrode, the method according to the present disclosure includes:

Step 1, as shown in FIG. 4A, of forming a gate line 41 and a gate insulating layer 420 sequentially;

Step 2, as shown in FIG. 4B, of forming one or more first via holes 421 in the gate insulating layer 420;

Step 3, as shown in FIG. 4C, of forming a source-drain metal pattern and a first portion 43 of the static charge releasing pattern in a same layer by a same material by means of a single patterning process, the first portion 43 of the static charge releasing pattern being connected to the gate line 41 through the first via hole 421 formed in the gate insulating layer 420 in the above Step 2;

Step 4, as shown in FIG. 4D, of depositing a passivation layer 44;

Step 5, as shown in FIG. 4E, of forming one or more second via holes 441 in the passivation layer 44;

Step 6, as shown in FIG. 4F, of forming a transparent electrode and a second portion 45 of the static charge releasing pattern in a same layer by a same material by means of a single patterning process, the second portion 45 of the static charge releasing pattern being connected to the first portion 43 of the static charge releasing pattern through the second via hole 441 formed in the passivation layer 44 in the above Step 5.

In summary, the method according to the present embodiments corresponds to the array substrate of the present disclosure and may achieve the same technical effects.

Figure 5:
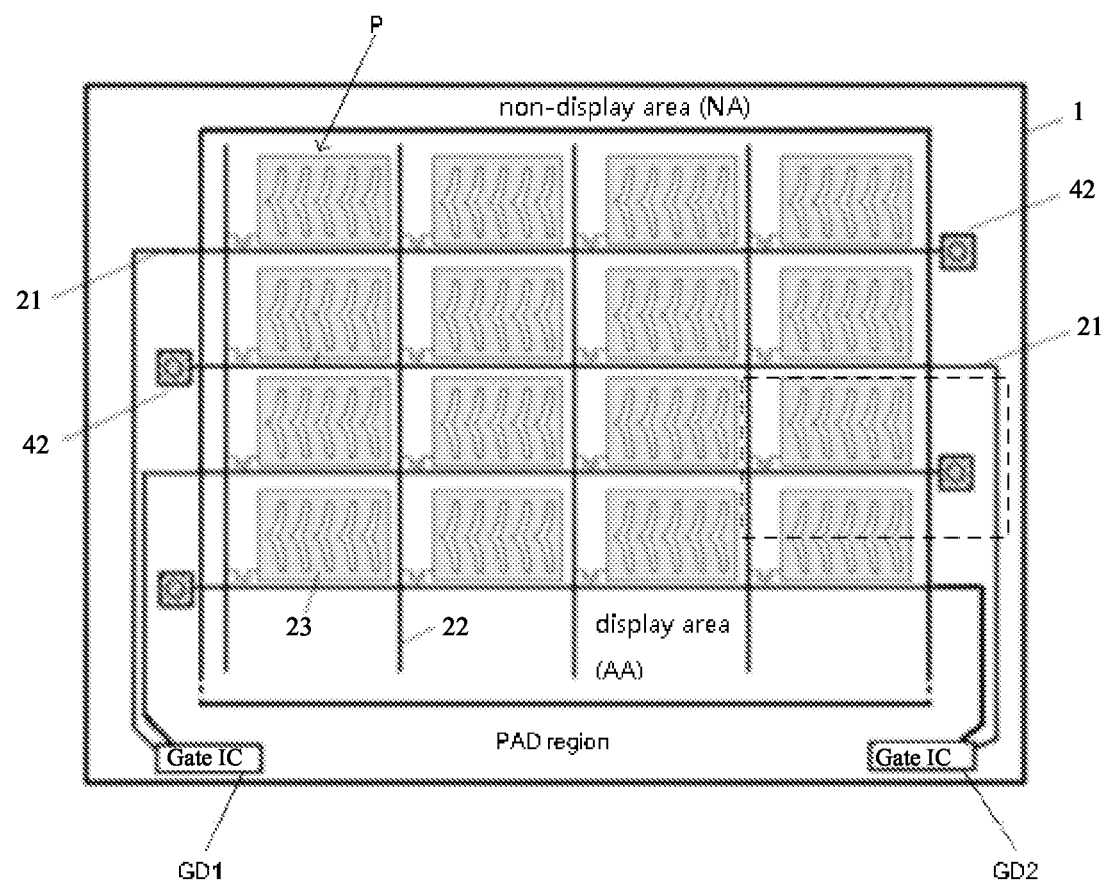
FIG. 5 is a schematic top view of an array substrate according to some other embodiments of the present disclosure.

Some other embodiments of the present disclosure provide an array substrate. FIG. 5 is a schematic plan view of an array substrate according to some other embodiments of the present disclosure. In the embodiments, the array substrate includes: a base substrate 1, and a gate line 21, a data line 22 and a static charge releasing pattern 42 which are formed on the base substrate 1.

In the embodiments, the case where the gate line 21 is the metal pattern is taken as an example for explanation. As shown in FIG. 5, a display area AA of the array substrate includes a plurality of pixels P arranged in an array, and each row of pixels P corresponds to one gate line 21, that is, one gate line 21 provides a scanning signal for one row of pixels. As a signal line, each of the gate lines 21 runs through the display area AA of the array substrate, and each of the gate lines 21 includes an input end for receiving the scanning signal, and the input end is located in a non-display area NA (including the crimping region) surrounding the display area AA and is connected to a gate line driver circuit Gate IC to load the scanning signal from the gate line driver circuit Gate IC. Each of the gate lines 21 further includes the other end, i.e., an output end, the output end is located in the non-display area NA, and is disposed adjacent to the display area AA. The input end and the output end in the present disclosure refer to two opposite ends of a continuous signal line, such as the gate line 21 or the data line 22.

As shown in FIG. 5, in the embodiments, the array substrate is a double gate driving array substrate including a first gate line driving circuit GD1 and a second gate line driving circuit GD2. An input end of an odd gate line 21 connected with an odd row of pixels is connected to the first gate line driving circuit GD1, and an input end of an even gate line 21 connected with an even row of pixels is connected to the second gate line driving circuit GD2. An output end of the odd gate line 21 connected with the odd row of pixels is located on a side of the display area AA, for example, the right side as shown in FIG. 5. An output end of the even gate line 21 connected with the even row of pixels is located on the other side of the display area AA, for example, the left side as shown in FIG. 5. The odd row of pixels and the even row of pixels in the embodiments are based on a case where the user faces the array substrate, as shown in FIG. 5, in the display area AA, the odd row of pixels and the even row of pixels are alternately arranged from top to bottom.

Different from the embodiments shown in FIG. 2, in the embodiments, each of the gate lines 21 is connected to a static charge releasing pattern 42 which is disposed at the output end of each gate line 21 and is electrically connected to the output end. As shown in FIG. 5, in each of the left and right sides of the display area AA, the static charge releasing pattern 42 is set one every two rows. Specifically, on the left side of the display area AA, the static charge releasing pattern 42 is disposed at the output end of the even gate line 21 connected with the even row of pixels, and electrically connected with the output end of the even gate line 21 connected with the even row of pixels; on the right side of the display area AA, the static charge releasing pattern 42 is disposed at the output end of the odd gate line 21 connected with the odd row of pixels, and electrically connected with the output end of the odd gate line 21 connected with the odd row of pixels.

With such a design, on one side of the display area (for example, the left side or the right side), a distance between any two adjacent static charge releasing patterns 42 corresponds to two pixel rows, and each static charge releasing pattern 42 may be designed to have a relatively large size, which is advantageous for release of static charges in the gate line 21.

Figure 6:
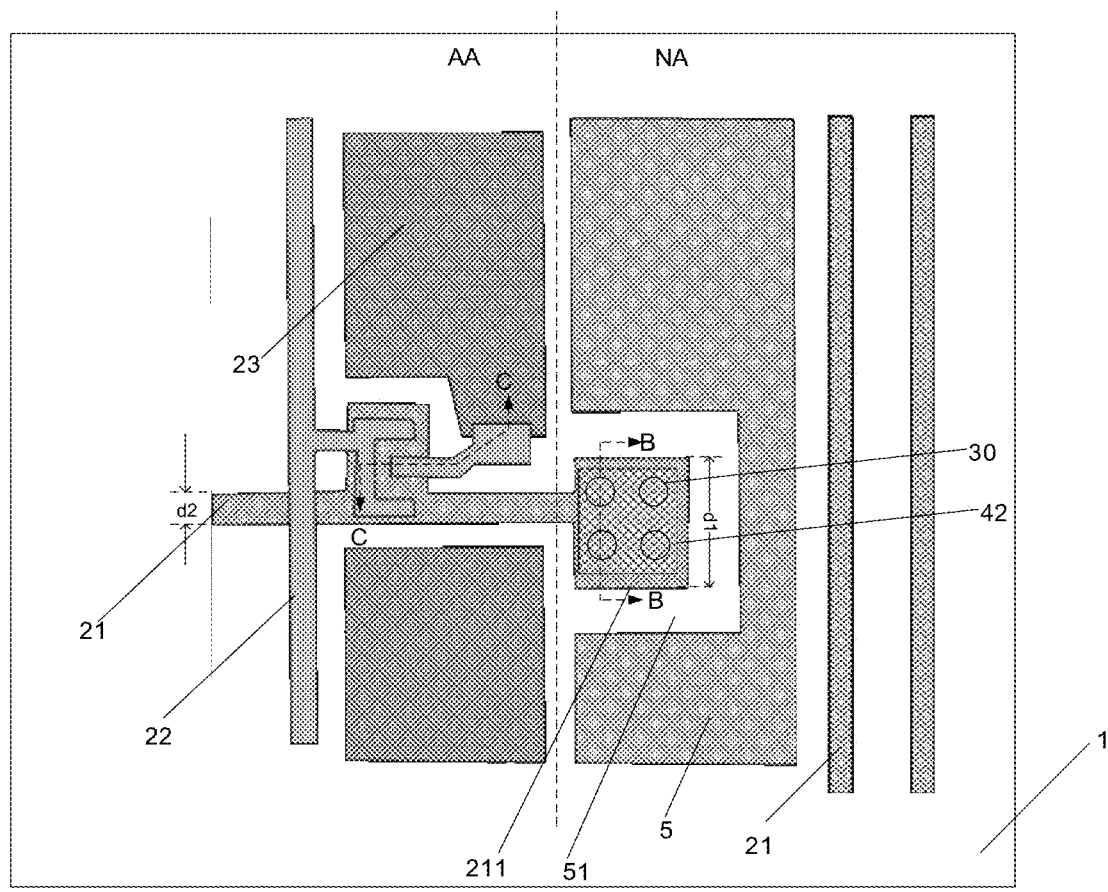
FIG. 6 is an enlarged view of a broken-line frame area in FIG. 5.

FIG. 6 is an enlarged view of a broken-line frame area in FIG. 5. As shown in FIG. 6, the output end of the gate line 21 includes an island-like structure 211, and a width d1 of the island-shaped structure 211 is larger than a line width d2 of the gate line 21. The line width d2 of the gate line 21 is a width of the body portion of the gate line 21 between the input end and the output end thereof. The island-like structure 211 is located in the non-display area NA which is adjacent to the display area AA. In the embodiments, the island-like structure 211 is in a shape of rectangle. Those skilled in the art may understand that, in other embodiments, the island-like structure may also have other shapes, such as a circular shape, an elliptical shape, etc., as long as the island-like structure has a relatively large area to facilitate an electrical connection with the static charge releasing pattern 42.

As shown in FIG. 5 and FIG. 6, the output end of the odd gate line 21 connected with the odd row of pixels is located on the right side of the display area AA. On the right side of the display area AA, a distance between any two adjacent island-like structures of the output ends corresponds to two pixel rows. Therefore, the island-like structure of the output end may be designed to have a relatively large size.

It may be understood by those skilled in the art that in other embodiments, the array substrate may include only one gate line driving circuit Gate IC, and the input end of each the gate line is connected to the gate line driving circuit Gate IC, and the island-like structure of the output end of each the gate line is located on the same side of the display area AA.

As shown in FIG. 6, the array substrate further includes a common electrode signal line 5 (the common electrode signal line is omitted in FIG. 5), and the common electrode signal line 5 is adjacent to the display area AA and has a large line width. The common electrode signal line 5 is used to supply a common voltage signal to a common electrode of the pixel P. As shown in FIG. 6, the common electrode signal line 5 is located between the display area AA and a portion of the even gate line 21 located in the non-display area NA. The common electrode signal line 5 may be disposed in the same layer as the gate line 21, but is insulated from the gate line 21. The common electrode signal line 5 has a groove 51 whose opening is disposed toward the display area AA, and the island-like structure 211 is disposed in the groove 51.

Figure 7:
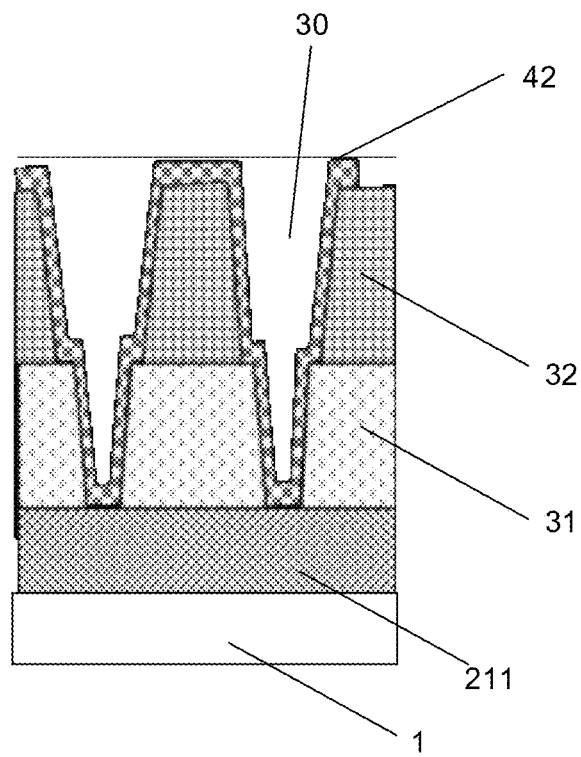
FIG. 7 is a cross-sectional view of the structure of FIG. 6 taken along line B-B.

FIG. 7 is a cross-sectional view of the structure of FIG. 6 taken along line B-B. As shown in FIG. 7, the array substrate further includes a gate insulating layer 31 disposed on the island-like structure 211 of the output end of the gate line 21 and a passivation layer 32 disposed on the gate insulating layer 31. The gate insulating layer 31 and the passivation layer 32 may be collectively referred to as an insulating layer 3. A via hole 30 is formed in the gate insulating layer 31 and the passivation layer 32, and the via hole 30 penetrates the gate insulating layer 31 and the passivation layer 32. The static charge releasing pattern 42 is disposed on the passivation layer 32 to be formed in the via hole 30. The static charge releasing pattern 42 is electrically connected to the island-like structure 211 of the output end of the gate line 21. The static charge releasing pattern 42 may be formed in the same layer as the electrically conductive pattern and made of a same material as the electrically conductive pattern, and the static charge releasing pattern 42 is insulated from the electrically conductive pattern. In the embodiments, the electrically conductive pattern is, for example, the common electrode of the pixel P.

The static charge releasing pattern 42 is configured to release a part of static charges in the metal pattern (such as the gate line 21 in the embodiments) to prevent the static charges in the metal pattern from breaking through the metal pattern to the electrically conductive pattern (such as the common electrode of the pixel P in the embodiments), thereby avoiding short circuit between the metal pattern and the electrically conductive pattern. Since the static charge releasing pattern and the electrically conductive pattern may be formed in one same patterning process, the cost for producing the array substrate of the embodiments will not be greater than that in the prior art. Thus, the array substrate according to the present disclosure is applicable.

As shown in FIG. 6 and FIG. 7, the static charge releasing pattern 42 is rectangular. An orthographic projection of the specific static charge releasing pattern 42 on the base substrate 1 is rectangular, and an area of the static charge releasing pattern 42 may be in a range of 25 $\mu m^2$ to 400 $\mu m^2$. The static charge releasing pattern 42 is electrically connected to the island-like structure 211 through the via hole 30 in the insulating layer 3. Each island-like structure 211 may corresponds one via hole or more, as shown in FIG. 6, each island-like structure 211 corresponds to four via holes 30. By providing a plurality of via holes corresponding to each island-like structure, a good electrical conductivity between the electrostatic discharge pattern 42 and the island-like structure 211 may be achieved.

As shown in FIG. 6 and FIG. 7, the orthographic projection of the static charge releasing pattern 42 on the base substrate 1 at least partially overlaps an orthographic projection of the island-like structure 211 on the base substrate 1. For example, the orthographic projection of the static charge releasing pattern 42 on the base substrate 1 falls within the orthographic projection of the island-like structure 211 on the base substrate 1, in this case, an area of the orthographic projection of the static charge releasing pattern 42 on the base substrate 1 is smaller than that of the orthographic projection of the island-like structure 211 on the base substrate 1.

In some embodiments, the orthographic projection of the static charge releasing pattern 42 on the base substrate 1 may coincide with the orthographic projection of the island-like structure 211 on the base substrate 1, in this case, the area of the orthographic projection of the static charge releasing pattern 42 on the base substrate 1 is equal to that of the orthographic projection of the island-like structure 211 on the base substrate 1.

In some embodiments, the orthographic projection of the island-like structure 211 on the base substrate 1 falls within the orthographic projection of the static charge releasing pattern 42 on the base substrate 1, in this case, the area of the orthographic projection of the static charge releasing pattern 42 on the base substrate 1 is greater than that of the orthographic projection of the island-like structure 211 on the base substrate 1.

Figure 8:
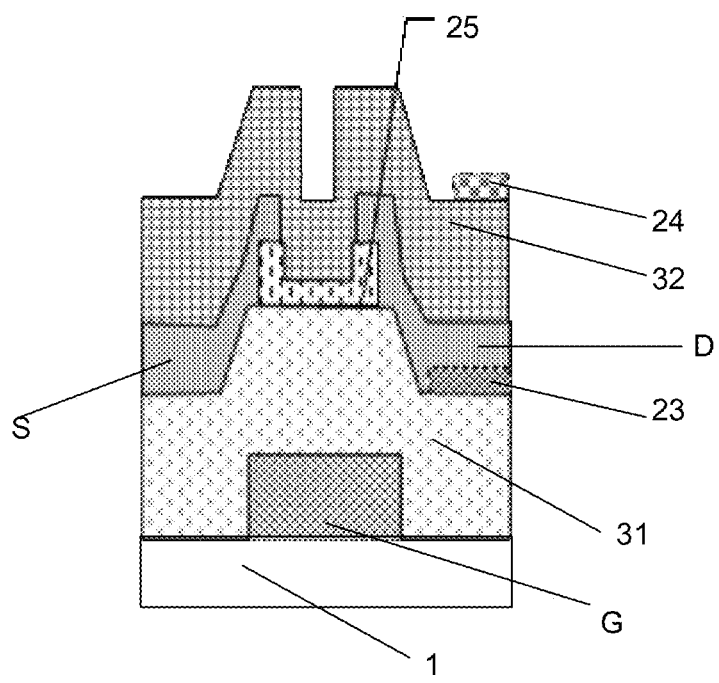
FIG. 8 is a cross-sectional view of the structure of FIG. 6 taken along line C-C.

FIG. 8 shows a cross-sectional view of the structure of FIG. 6 taken along line C-C. As shown in FIG. 8, in the embodiments, the array substrate is an array substrate of an in-plane switching mode, and a switching element of the pixel P adopt a thin film transistor of a bottom-gate structure. Those skilled in the art may understand that, in other embodiments, the switching element of the pixel P may also adopt a thin film transistor of a top-gate structure.

As shown in FIG. 6 and FIG. 8, a gate electrode G of the thin film transistor extends from the gate line 21, and the gate G and the gate line 21 are made of the same material and formed on the base substrate 1 by the same patterning process. The gate insulating layer 31 is disposed on a side of the gate electrode G away from the base substrate 1 and covers the gate electrode G. A pixel electrode 23 of the pixel P is disposed on the gate insulating layer 31, and the pixel electrode 23 is a transparent electrode, such as ITO. An active layer 25 of the thin film transistor is disposed on a side of the gate insulating layer 31 away from the base substrate 1, and an orthographic projection of the active layer 25 on the base substrate 1 falls within an orthographic projection of the gate electrode G on the base substrate 1. The thin film transistor further includes a source electrode S and a drain electrode D, i.e., a source-drain metal layer pattern, which are made of a metal material. The source electrode S and the drain electrode D are disposed on a side of the active layer 25 away from the base substrate 1, and the source electrode S is electrically connected to the data line 22, and the drain electrode D is electrically connected to the pixel electrode 23. In the embodiments, the drain electrode D is disposed on a side of the pixel electrode 23 away from the base substrate 1 and is in direct electrical contact with the pixel electrode 23. The source-drain metal layer pattern, i.e., the source electrode S and the drain electrode D, is made of the same material and formed in the same patterning process as the data line 22, that is, the source-drain metal layer pattern is disposed in the same layer as the data line 22. As shown in FIG. 8, the passivation layer 32 is disposed on a side of the source-drain metal layer pattern away from the base substrate 1, and the common electrode 24 of the pixel P is disposed on a side of the passivation layer 32 away from the base substrate 1. The common electrode 24 is a transparent electrode, such as ITO. In FIG. 6, in order to clearly show the positional relationship of the respective components, the gate insulating layer 31, the passivation layer 32, and the common electrode 24 of the pixel P are omitted.

In the embodiments, the array substrate is, for example, an array substrate of an FFS mode or an ADS mode, and a slit is formed on one of the pixel electrode 23 and the common electrode 24 such that the pixel electrode 23 and the common electrode 24 form an in-plane electric field when a voltage is applied.

In some embodiments, the common electrode 24 of the plurality of pixels P may be continuous and electrically connected to the common electrode signal line 5 for receiving a common voltage signal.

In the embodiments shown in FIG. 7 and FIG. 8, the metal pattern is the gate line 21, and the static charge releasing pattern is made of the same material and formed in the same layer as the common electrode of the pixel P. In other embodiments, in a case where the metal pattern is the gate line 21, the static charge releasing pattern may be made of the same material and formed in the same layer as the source-drain metal layer pattern and the data line 22, in this case, the via hole only needs to penetrate the insulating layer 31 so that the static charge releasing pattern is electrically connected to the island-like structure 211 of the output end of the gate line 21. Alternatively, in other embodiments, in a case where the metal pattern is the gate line 21, the static charge releasing pattern may be made of the same material and formed in the same layer as the pixel electrode 23 of the pixel P, in this case, the via hole only needs to penetrate the insulating layer 31 so that the static charge releasing pattern is electrically connected to the island-like structure 211 of the output end of the gate line 21.

In other embodiments, the static charge releasing pattern may also include a laminated structure similar to that of FIG. 3, and the static charge releasing pattern may include a first portion which is made of the same material and formed in the same layer as the source-drain metal layer pattern and the data line 22, and a second portion which is made of the same material and formed in the same layer as the common electrode 24 of the pixel P; alternatively, the static charge releasing pattern may include a first portion which is made of the same material and formed in the same layer as the pixel electrode 23 of the pixel P, and a second portion which is made of the same material and formed in the same layer as the common electrode 24 of the pixel P.

In some embodiments, the metal pattern may be the data line 22, and an output end of the data line 22 may also include an island-like structure. In this case, the static charge releasing pattern may be made of the same material and formed in the same layer as the common electrode 24 of the pixel P. The static charge releasing pattern electrically connected to the island-like structure of the output end of the data line 22 through a via penetrating the passivation layer 32. The static charge releasing pattern is configured to release a part of static charges in the metal pattern (such as the data line 21 in the embodiments) to prevent the static charges in the metal pattern from breaking through the metal pattern to the electrically conductive pattern (such as the common electrode of the pixel P in the embodiments), thereby avoiding short circuit between the metal pattern and the electrically conductive pattern.

Some embodiments of the present disclosure also provide a method for producing an array substrate. The method includes a step of sequentially forming a metal pattern and an electrically conductive pattern on a base substrate. The metal pattern is a signal line which runs through a display area, and the metal pattern includes: an input end, an output end, and a body portion between the input end and the output end. The output end of the signal line includes an island-like structure, and a width of the island-like structure is greater than a width of the body portion.

In the method, in a patterning process of forming the electrically conductive pattern, a static charge releasing pattern insulated from the electrically conductive pattern and electrically connected to the metal pattern is also formed, for example, the static charge releasing pattern is electrically connected to the island-like structure of the output end of the signal line.

In the method according to the embodiments, the static charge releasing pattern connected with the metal pattern is additionally formed in the process for producing the electrically conductive pattern. The static charge releasing pattern is configured to release part of the static charges in the metal pattern to prevent the static charges from the metal pattern from breaking through the metal pattern to the electrically conductive pattern, thereby avoiding short circuit between the metal pattern and the electrically conductive pattern. Since the static charge releasing pattern may be formed by the patterning process of the electrically conductive pattern, the manufacturing cost of the array substrate in the embodiments will not be increased. The array substrate according to the present disclosure is highly applicable.

Further, the method according to the embodiments further includes: a step of forming an insulating layer disposed between the electrically conductive pattern and the metal pattern. In this step, by forming a via hole in the insulating layer, the static charge releasing pattern is connected to the metal pattern through the via hole in the insulating layer.

The above embodiments are only exemplary embodiments of the present disclosure. It should be noted that the skilled person in the art may make various modifications and alternations of the present disclosure without departing the principles of the present application. These modifications and alternations also fall within the protection scope of the present disclosure.

What is claimed is:

1. An array substrate, comprising a metal pattern and an electrically conductive pattern which are sequentially formed on a base substrate, the electrically conductive pattern being insulated from the metal pattern, wherein the array substrate further comprises:
   a static charge releasing pattern formed in a same layer as the electrically conductive pattern and made of a same material as the electrically conductive pattern, the static charge releasing pattern being insulated from the electrically conductive pattern and electrically connected with the metal pattern,
   wherein the metal pattern is a signal line which runs through a display area of the array substrate, and the signal line comprises:
   an input end;
   an output end; and
   a body portion between the input end and the output end,
   wherein the output end of the signal line comprises an island-like structure, and a width of the island-like structure is greater than a width of the body portion, and
   wherein the static charge releasing pattern is electrically connected with the island-like structure.

2. The array substrate according to claim 1, wherein an insulating layer is disposed between the electrically conductive pattern and the metal pattern, a via hole is disposed in the insulating layer, and the static charge releasing pattern is electrically connected to the metal pattern through the via hole.

3. The array substrate according to claim 1, wherein the metal pattern is a gate line, the array substrate comprises a plurality of rows of pixels and a plurality of gate lines, each of the plurality of gate lines is connected to a row of pixels, an input end of an odd gate line connected with an odd row of pixels is connected to a first gate line driving circuit, and an input end of an even gate line connected with an even row of pixels is connected to a second gate line driving circuit, wherein an output end of the odd gate line connected with the odd row of pixels is located on a side of the display area, and an output end of the even gate line connected with the even row of pixels is located on the other side of the display area opposite to the side.

4. The array substrate according to claim 1, wherein the island-like structure is rectangular.

5. The array substrate according to claim 1, wherein the first static charge releasing pattern is in a shape of a rectangle having an area of 25 $\mu m^2$ to 400 $\mu m^2$.

6. The array substrate according to claim 1, wherein an orthographic projection of the static charge releasing pattern on the base substrate at least partially overlaps an orthographic projection of the island-like structure on the base substrate.

7. The array substrate according to claim 2, wherein the static charge releasing pattern is electrically connected with the island-like structure through at least two via holes in the insulating layer.

8. The array substrate according to claim 1, further comprising:
   a common electrode signal line disposed in the same layer as the metal pattern and adjacent to the display area,
   wherein the common electrode signal line has a groove whose opening is disposed toward the display area, and the island-like structure is disposed in the groove.

9. The array substrate according to claim 1, wherein the metal pattern is a gate line, and the electrically conductive pattern comprises a source-drain metal layer pattern.

10. The array substrate according to claim 9, wherein the electrically conductive pattern further comprises a data line.

11. The array substrate according to claim 1, wherein the metal pattern is a gate line, and the electrically conductive pattern comprises a transparent electrode.

12. The array substrate according to claim 11, wherein the transparent electrode comprises a pixel electrode or a common electrode.

13. The array substrate according to claim 1, wherein the metal pattern is a data line, and the electrically conductive pattern comprises a transparent electrode.

14. The array substrate according to claim 13, wherein the transparent electrode comprises a pixel electrode or a common electrode.

15. A method for producing an array substrate, comprising a step of sequentially forming a metal pattern and an electrically conductive pattern on a base substrate, the electrically conductive pattern being insulated from the metal pattern;
   wherein in a patterning process for forming the electrically conductive pattern, a static charge releasing pattern insulated from the electrically conductive pattern and electrically connected with the metal pattern is also formed, the static charge releasing pattern being formed in a same layer as the electrically conductive pattern and made of a same material as the electrically conductive pattern, and
   wherein the metal pattern is a signal line which runs through a display area of the array substrate, and the signal line comprises:
      an input end;
      an output end; and
      a body portion between the input end and the output end,
   wherein the output end of the signal line comprises an island-like structure, and a width of the island-like structure is greater than a width of the body portion, and
   wherein the static charge releasing pattern is electrically connected with the island-like structure.

16. The method according to claim 15, further comprising:
   a step of forming an insulating layer which is disposed between the electrically conductive pattern and the metal pattern and has a via hole;
   wherein the static charge releasing pattern is electrically connected to the island-like structure through the via hole.

* * * * *